(12) United States Patent
Draxelmayr (10) Patent No.: US 7,365,601 B2
(45) Date of Patent: Apr. 29, 2008

(54) AMPLIFIER FOR AMPLIFYING A SIGNAL (75) Inventor: Dieter Draxelmayr, Villach (AT)

(73) Assignee: Infineon Technologies AG, Munich (DE)

( * ) Notice: Subject to any disclaimer, the term of this patent is extended or adjusted under 35 U.S.C. 154(b) by 45 days.

(21) Appl. No.: 11/114,903

(22) Filed: Apr. 25, 2005

(65) Prior Publication Data

US 2005/0264362 A1  Dec. 1, 2005

(30) Foreign Application Priority Data

Apr. 23, 2004 (DE) ............ 10 2004 020 380

(51) Int. Cl.
*H03F 3/04* (2006.01)
(52) U.S. Cl. ............... 330/288; 330/253
(58) Field of Classification Search ......... 330/253, 330/257, 288
See application file for complete search history.

(56) References Cited

U.S. PATENT DOCUMENTS 4,267,517 A * 5/1981 Iida et al. .......... 330/257
6,157,259 A * 12/2000 Dasgupta ........... 330/288
6,278,326 B1 * 8/2001 Murray et al. ..... 330/288

OTHER PUBLICATIONS

Tietze, U.; Schenk, Ch.: Halbleiter-Schaltungstechnik, 11. Augl., Berlin, Springer, 1999, pp. 314, 315, and 340-343, (5 pages).

* cited by examiner

*Primary Examiner*—Khanh Van Nguyen
(74) *Attorney, Agent, or Firm*—Maginot, Moore & Beck (57) ABSTRACT

An amplifier for amplifying a signal which is applied to a signal input having a first pair of transistors (10), which is connected to the signal input and which contains two transistors (10-1, 10-2), currents flowing through the two transistors (10-1, 10-2) which have a specific operating current ratio (m) in relation to one another, a second pair of transistors (4), which is connected to the first pair of transistors (10) and which contains two transistors (4-1, 4-2), currents flowing through the two transistors (4-1, 4-2) which have the same operating current ratio (m) in relation to one another, and a signal output (3) of the amplifier (1) being provided between the first pair of transistors (10) and the second pair of transistors (4).

8 Claims, 6 Drawing Sheets

AMPLIFIER FOR AMPLIFYING A SIGNAL

FIELD OF THE INVENTION

The invention relates to an amplifier for amplifying a signal which is applied to a signal input, operating currents being used which have a certain ratio in relation to one another.

BACKGROUND

Figure 1:
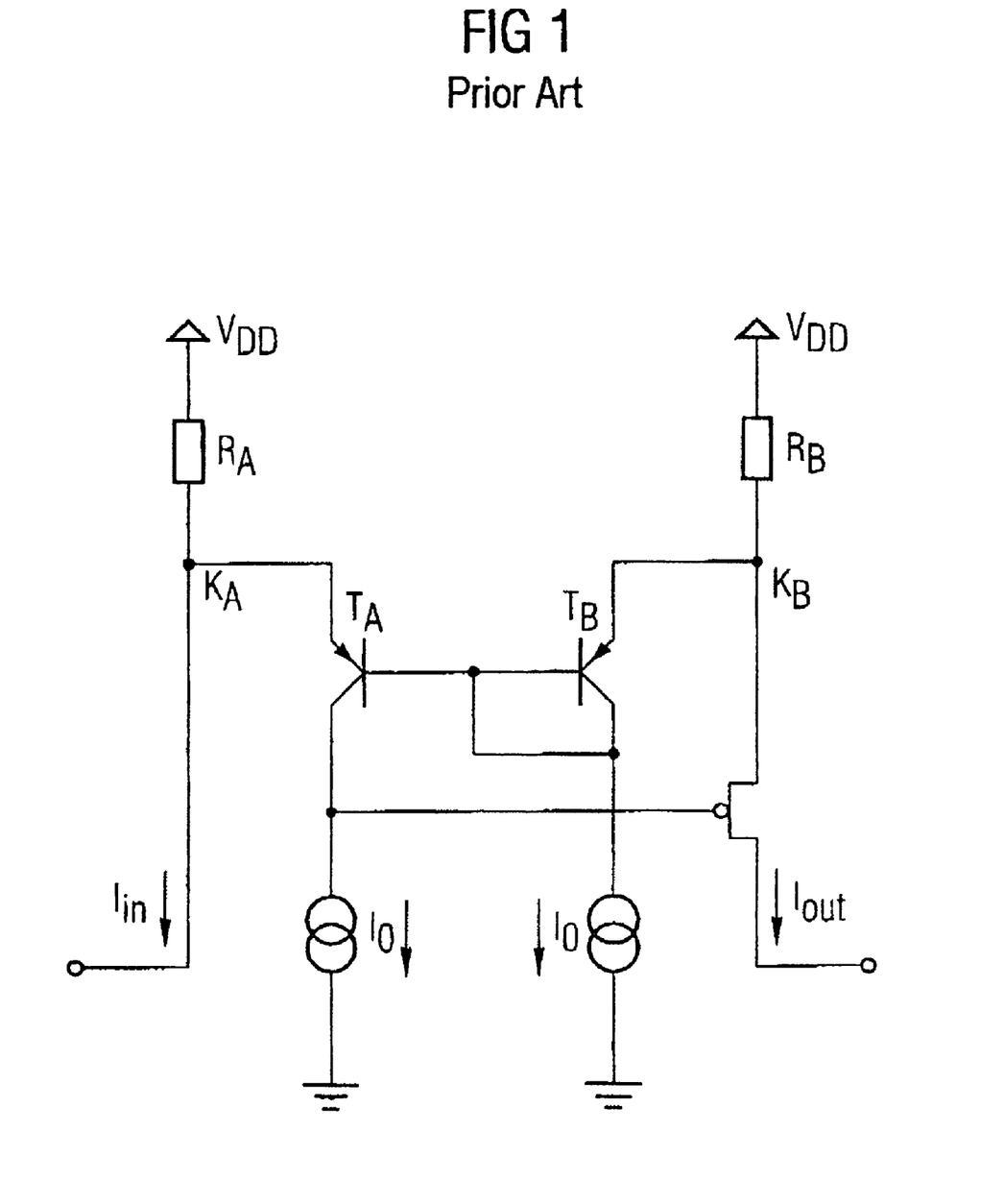
FIG. 1 shows a current mirror circuit according to the prior art.

FIG. 1 shows a current mirror circuit according to the prior art. The current mirror circuit according to the prior art, as is illustrated in FIG. 1, serves the purpose of converting an input current $I_{in}$ into an output current $I_{out}$ at a certain mirror ratio. If the potential is at the same level at the two nodes $K_A$, $K_B$, the current ratio between the input current $I_{in}$ and the mirrored output current $I_{out}$ is determined by the ratio of the resistance values of the two resistors $R_A$, $R_B$:

$$\frac{I_{in}}{I_{out}} = \frac{R_B}{R_A},$$

where $R_A \neq R_B$.

However, this only applies if the two internal operating currents $I_0$ which are produced by two current sources are small enough for them to be negligible compared to the input current $I_{in}$ and the mirrored output current $I_{out}$. The current mirror circuit shown in FIG. 1 and according to the prior art therefore has the disadvantage that, owing to the internal operating currents $I_0$ which are not negligibly small, an error occurs in the current mirroring.

Figure 2:
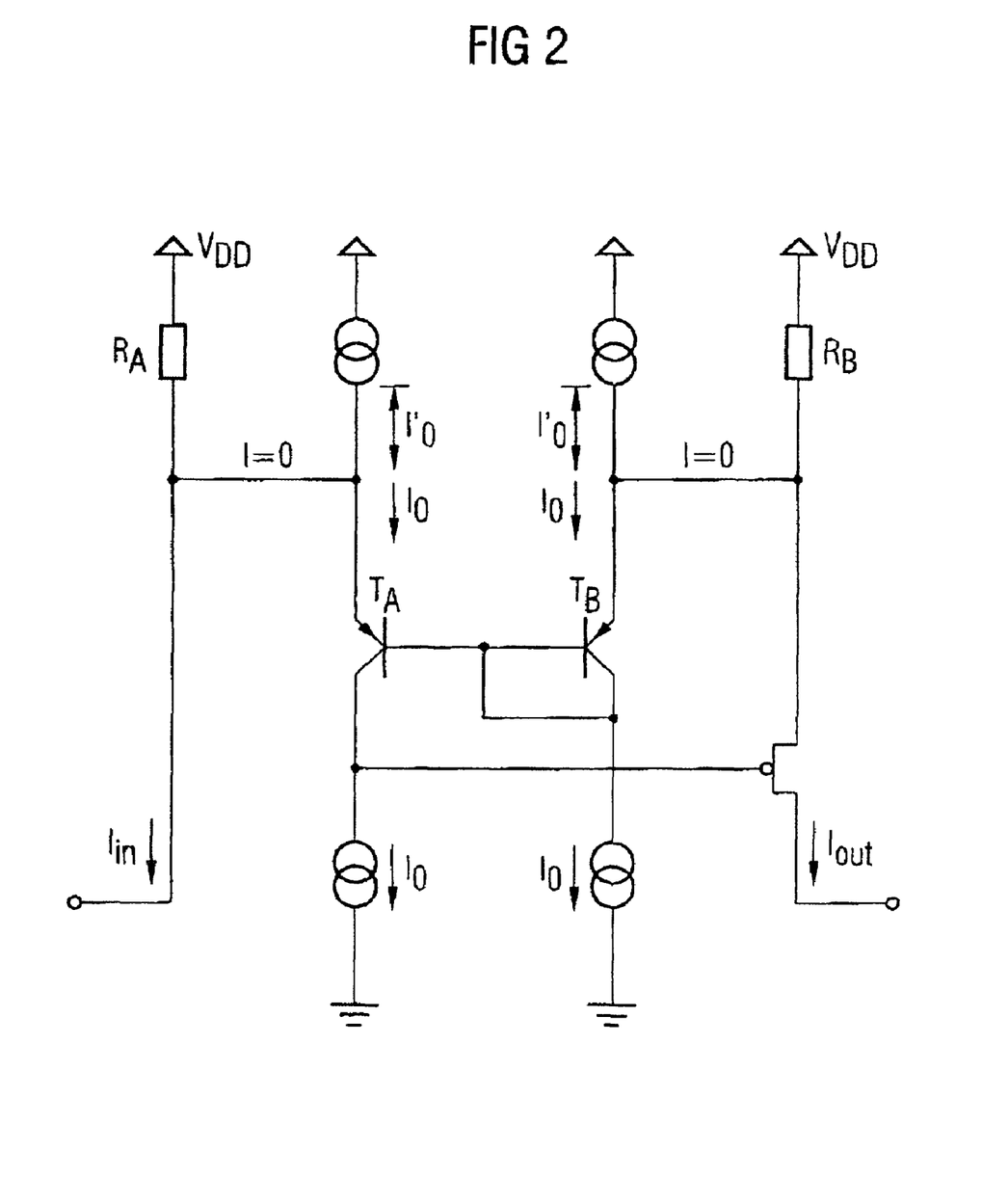
FIG. 2 shows a current mirror circuit having current compensation.

An obvious way of avoiding this disadvantage is a current compensation circuit, as illustrated in FIG. 2. The current mirror circuit shown in FIG. 2 has two further internal current sources which produce currents $I_0$. The current compensation current sources compensate for the current error which occurs in the conventional current mirror circuit illustrated in FIG. 1.

The disadvantage of the current mirror circuit illustrated in FIG. 2 consists in the fact that additional current compensation sources need to be provided for the purpose of producing the compensation currents $I_0$. Overall, the current mirror circuit shown in FIG. 2 can only be implemented in a relatively complex manner in terms of circuitry.

A further disadvantage of the circuit illustrated in FIG. 2 consists in the fact that the current compensation sources require relatively high saturation voltages, i.e. the voltage drops across the resistors $R_A$, $R_B$ need to be large. As a result, the power loss increases, and the supply voltage $V_{DD}$ is higher.

SUMMARY

This object is achieved according to the invention by an amplifier having the features specified in patent claim 1.

The invention provides an amplifier for amplifying a signal which is applied to a signal input having a first pair of transistors (10), which is connected to the signal input and which contains two transistors (10-1, 10-2), currents flowing through the two transistors (10-1, 10-2) which have a specific operating current ratio (m) in relation to one another;

a second pair of transistors (4), which is connected to the first pair of transistors (10) and which contains two transistors (4-1, 4-2), currents flowing through the two transistors (4-1, 4-2) which have the same operating current ratio (m) in relation to one another, a signal output (3) of the amplifier (1) being provided between the first pair or transistors (10) and the second pair of transistors (4).

In one preferred embodiment, the transistors of the first pair of transistors have the same current density.

In a further preferred embodiment, the transistors of the second pair of transistors are load transistors which are connected to a supply voltage.

In one preferred embodiment, the first pair of transistors is connected in the form of a cascode stage.

In this case, a third pair of transistors is preferably connected to the first pair of transistors, the third pair of transistors containing two transistors through which currents flow which have the specific operating current ratio.

In one preferred embodiment, the second pair of transistors is formed by a current mirror circuit.

In one embodiment of the amplifier according to the invention, the transistors are MOS field-effect transistors.

In one alternative embodiment, the transistors are bipolar transistors.

In one preferred embodiment of the amplifier according to the invention, the transistors of the first pair of transistors are each connected to a supply voltage via a resistor.

The amplifier according to the invention in this case advantageously requires only a low supply voltage $V_{DD}$.

BRIEF DESCRIPTION OF THE DRAWINGS

In this case, the ratio of the resistance values of the two resistors is preferably equal to the operating current ratio. Preferred embodiments of the amplifier according to the invention will be described below with reference to the attached figures, in which.

DETAILED DESCRIPTION

Figure 3:
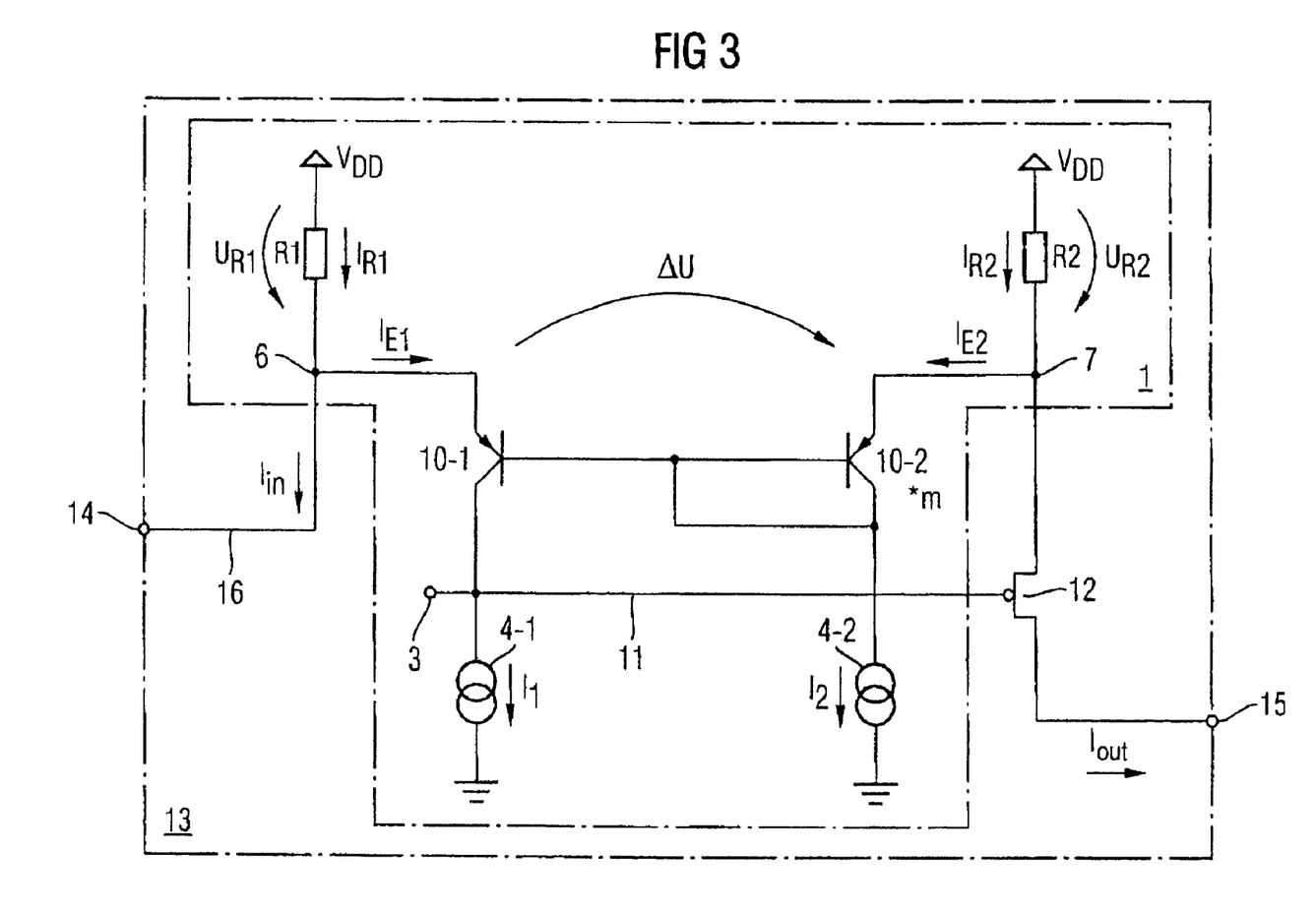
FIG. 3 shows a first embodiment of the amplifier according to the invention.

FIG. 3 shows a first embodiment of the amplifier 1 according to the invention.

The amplifier 1 has a first pair of transistors 10, which contains two transistors 10-1, 10-2. In the first embodiment shown in FIG. 3, the transistors 10-1, 10-2 are in the form of PNP bipolar transistors. The base connections of the two transistors 10-1, 10-2 are short-circuited with one another, the base connections being connected to the collector connection of the second bipolar transistor 10-2 via a line. In the first embodiment illustrated in FIG. 3, the collector connections of the two bipolar transistors 10-1, 10-2 are connected to the current sources 4-1, 4-2. The two current sources 4-1, 4-2 are preferably likewise in the form of a pair of transistors. The two current sources 4-1, 4-2 produce currents which have the same operating current ratio m as the currents of the first pair of transistors 10. The current densities in the two transistors 10-1, 10-2 of the first pair of transistors 10 are the same, since the emitter areas of the two transistors 10-1, 10-2 likewise have a ratio m in relation to one another. The two current sources 4-1, 4-2 are connected to a negative supply voltage $V_{SS}$ which is preferably ground.

In the circuit shown in FIG. 3, the amplifier 1 according to the invention is used in a current mirror circuit which mirrors an input current $I_{in}$ to form an output current $I_{out}$. The mirrored output current $I_{out}$ is in this case supplied to a downstream circuit. For this purpose, the signal output 3 of the amplifier 1 according to the invention, which is provided between the first pair of transistors 10 and the second pair of transistors 4, is connected to a gate connection of a PMOS transistor 12 via a line 11.

The current mirror circuit 13, which contains the signal amplifier 1 according to the invention, has a current input 14 for the purpose of receiving the input current $I_{in}$ to be mirrored and a current output 15 for the purpose of outputting the mirrored current $I_{out}$. The current input 14 is connected to a first current node 6 via a line 16, an input current $I_{E1}$ flowing to the emitter connection of the PNP transistor 10-1 via said current node 6. The first current node 6 is connected to a positive supply voltage $V_{DD}$ via a first resistor $R_1$.

The emitter connection of the second transistor 10-2 is connected to a second current node 7, from which a second input current $I_{E2}$ flows. The second current node 7 is connected to the positive supply voltage $V_{DD}$ via a second resistor $R_2$. The output transistor 12 of the current mirror circuit 13 is connected between the second current node 7 and the current output 15 of the current mirror circuit 13.

Disregarding the slight base currents, the input current $I_{E1}$ at the emitter of the first transistor 10-1 is equal to the current $I_1$ which is produced by the current source 4-1:

$$I_{E1}=I_1 \quad (1)$$

In the same way, the current $I_{E2}$ flowing into the emitter connection of the second transistor 10-2 is equal to the current $I_2$ produced by the current source 4-2:

$$I_{E2}=I_2 \quad (2)$$

The current sources 4-1, 4-2 are formed by a second pair of transistors, the currents flowing through the two transistors 4-1, 4-2 having the same operating current ratio m as the currents flowing through the first pair of transistors 10.

The following equation is thus true:

$$I_2=m \cdot I_1 \quad (3)$$

If equation (3) is inserted in equation (2), the following results:

$$I_{E2}=m \cdot I_1 \quad (4)$$

and with equation (1), equation (5) results:

$$I_{E2}=m \cdot I_{E1} \quad (5)$$

The two transistors 10-1, 10-2 are operated at the same current density, with the result that the voltage difference $\Delta U$ between the first current node 6 and the second current node 7 becomes zero. This results in the voltages which are present across the two resistors $R_1$, $R_2$ being equal in value.

$$U_{R1}=U_{R2} \quad (6)$$

The following current equation can be established at the first current node 6:

$$I_{R1}=I_{E1}+I_{in} \quad (7)$$

The following current equation can be established at the second current node 7:

$$I_{R2} = I_{E2} + I_{out}, \text{ where} \quad (8)$$

$$I_{R1} = \frac{U_{R1}}{R_1} \text{ and} \quad (9)$$

$$I_{R2} = \frac{U_{R2}}{R_2}. \quad (10)$$

The two resistors $R_1$, $R_2$ are dimensioned such that the ratio of the two resistance values corresponds to the operating current ratio m.

$$R_1 = m \cdot R_2 \quad (11)$$

Inserting equation (9) in equation (7) gives:

$$\frac{U_{R1}}{R_1} = I_{E1} + I_{in} \quad (12)$$

Inserting equation (10) in equation (8) gives:

$$\frac{U_{R2}}{R_2} = I_{E2} + I_{out} \quad (13)$$

Transformation of equation (12) by inserting equation 911) and taking equation (6) into consideration gives:

$$\frac{U_{R2}}{m \cdot R_2} - I_{E1} = I_{in} \quad (14)$$

Transformation of equation (13) gives equation (15):

$$\frac{U_{R2}}{R_2} - I_{E2} = I_{out} \quad (15)$$

Using equation (5), it is possible to produce equation (16) from equation (14):

$$\frac{U_{R2}}{m \cdot R_2} - \frac{I_{E2}}{m} = I_{in} \quad (16)$$

By comparing the two equations (15), (16), equation (17) results:

$$I_{out}=m \cdot I_{in} \quad (17)$$

The output current of the current mirror circuit 13 thus has m-times the value of the input current $I_{in}$.

The amplifier 1 according to the invention adjusts the voltage difference $\Delta U$ between the current nodes 6, 7 to zero. The amplifier 1 according to the invention thus acts in a similar manner to an operational amplifier.

Figure 4:
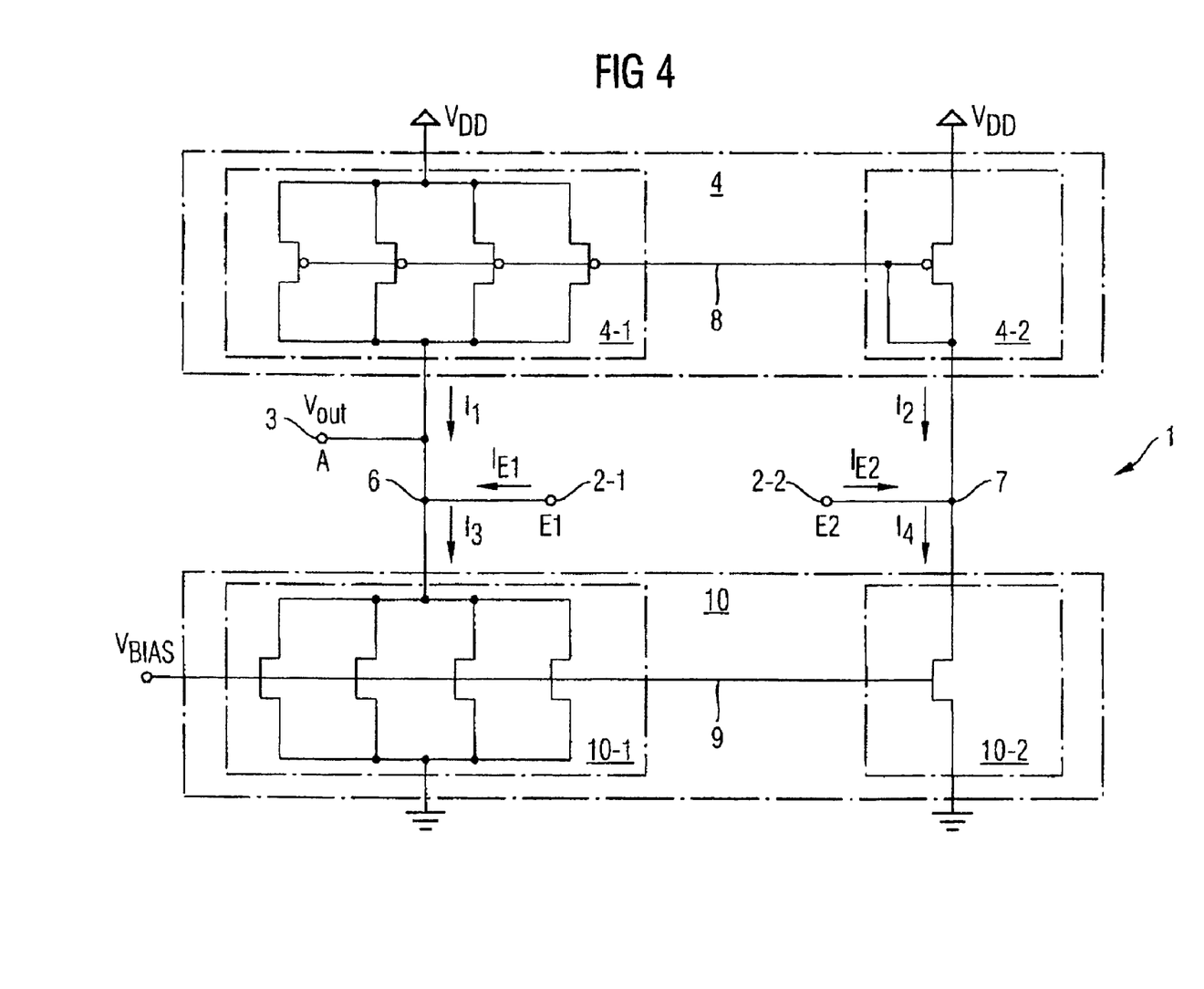
FIG. 4 shows a second embodiment of the amplifier according to the invention.

FIG. 4 shows a second embodiment of the amplifier 1 according to the invention. The amplifier 1 has a signal input 2-1, 2-2 and an output 3. Furthermore, the amplifier 1, as illustrated in FIG. 4, contains a current mirror 4 and a pair of current sources 10. The current mirror 4 serves the purpose of producing two currents $I_1$, $I_2$, which have a predetermined operating current ratio m in relation to one another. The current mirror 4 contains transistors 4-1, which are connected in parallel and which form a large-area transistor for the purpose of producing the first operating current $I_1$, the transistors 4-1 being connected to a first current node 6. In addition, the current mirror 4 has a transistor 4-2, which is provided for the purpose of producing the second operating current $I_2$. The transistor 4-2 is connected to a second current node 7.

The pair of transistors 10 comprises a current source 10-1, comprising transistors 1, for the purpose of producing the third operating current $I_3$ and a current source 10-2 for the purpose of producing the fourth operating current $I_4$. In this case, the current source 10-1 is connected, as is the transistor 4-1, to the first current node 6. The current source 10-2 is connected, as is the transistor 4-2, to the second current node 7.

The two operating currents $I_1$, $I_2$, which are produced by the current mirror 4, have a specific current ratio m in relation to one another.

$$I_1 = m \cdot I_2 \quad (18)$$

The two operating currents $I_3$, $I_4$, which are produced by the second pair of current sources 10, have the same operating current ratio m in relation to one another:

$$I_3 = m \cdot I_4 \quad (19)$$

The two nodes 6, 7 form summation current nodes such that the following equations are true:

$$I_1 + I_{E1} = I_3 \quad (20)$$

$$I_2 + I_{E2} = I_4 \quad (21)$$

where $I_{E1}$, $I_{E2}$ are the input currents at the signal input 2.

The following equation results from this, if equation (18) is inserted in equation (20):

$$mI_2 + I_{E1} = I_3 \quad (22)$$

Inserting equation (19) in equation (22) gives equation (23):

$$mI_2 + I_{E1} = mI_4 \quad (23)$$

If, in addition, equation (21) is inserted in equation (23), equation (24) results:

$$mI_2 + I_{E1} = mI_2 + mI_{E2} \quad (24)$$

Reduction gives equation (25):

$$I_{E1} = m \cdot I_{E2} \quad (25)$$

As can be seen from equation (25), the two input currents which are applied to the current input 2-1, 2-2 have, when the amplifier circuit 1 is in a state of equilibrium, a predetermined ratio m which corresponds to the current ratio of the operating currents.

This operating current ratio m in all embodiments of the amplifier 1 according to the invention is a rational number which is not equal to one.

In the second embodiment illustrated in FIG. 4, the transistors 4-1 which are connected in parallel are PMOS transistors.

The gate connections of these PMOS transistors 4-1 are connected to the gate connection of a PMOS transistor 4-2 via a line 8.

In the second embodiment illustrated in FIG. 4, the transistors of the pair of transistors 10 are in the form of NMOS transistors. In this case, the current source 10-1 comprises a plurality of NMOS transistors connected in parallel. The current source 10-2 is formed by a single NMOS transistor. The gate connections of the NMOS transistors within the current source 10-1 are connected to the gate connection of the NMOS transistor 10-2 via a line 9. A bias voltage $V_{bias}$ is applied to the gate connections of the pair of transistors 10.

In the second embodiment illustrated in FIG. 4, the output 3 of the amplifier 1 is connected directly to the highly resistive summation node 6.

Figure 5:
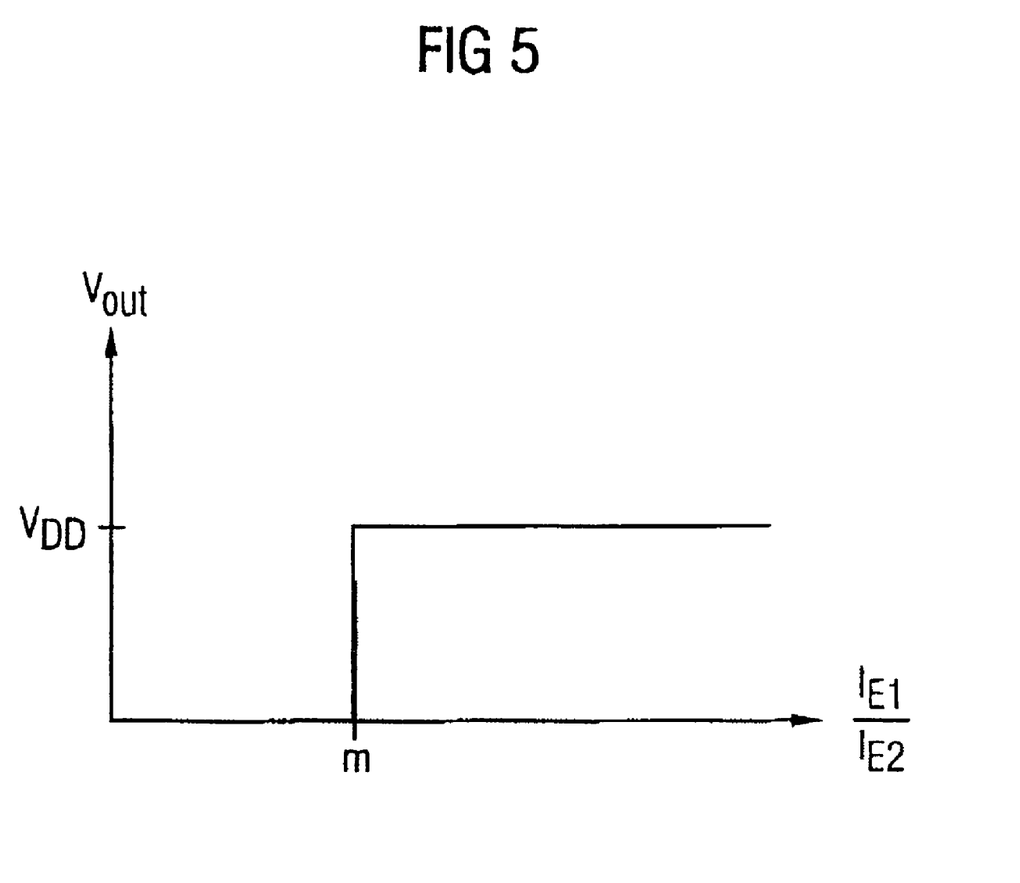
FIG. 5 shows a characteristic for the purpose of explaining the operation of the amplifier according to the invention.

FIG. 5 shows the operation of the amplifier circuit 1 according to the invention which is illustrated in FIG. 4 for ideally operating transistors. If the current $I_{E1}$, which is flowing at the first current input 2-1, is greater than the current $I_{E2}$, which is flowing at the second current input 2-2, precisely by a factor m, the amplifier circuit 1 is in equilibrium. As soon as the current $I_{E1}$ is slightly greater than m-times the value of $I_{E2}$, the state of equilibrium is left and the amplifier circuit 1 produces an output voltage at the output 3 which corresponds to the positive supply voltage $V_{DD}$ of the amplifier circuit 1. If the current, which flows at the first current input 2-1, is only slightly less than m-times the value of the input current $I_{E1}$, which flows at the current input 2-2, the amplifier circuit 1 outputs an output voltage which corresponds to the negative supply voltage $V_{SS}$ which corresponds to the ground voltage in the example illustrated in FIG. 4.

In the second embodiment illustrated in FIG. 4, the transistors provided are in the form of MOSFET transistors.

In an alternative embodiment, the transistors of the amplifier circuit 1 according to the invention are in the form of bipolar transistors.

The transistors of the current mirror 4 and of the pair of transistors 10 are preferably designed to be complementary to one another. As can be seen from FIG. 4, the current mirror 4 has PMOS transistors, whereas the pair of transistors 10 comprises NMOS transistors.

Figure 6:
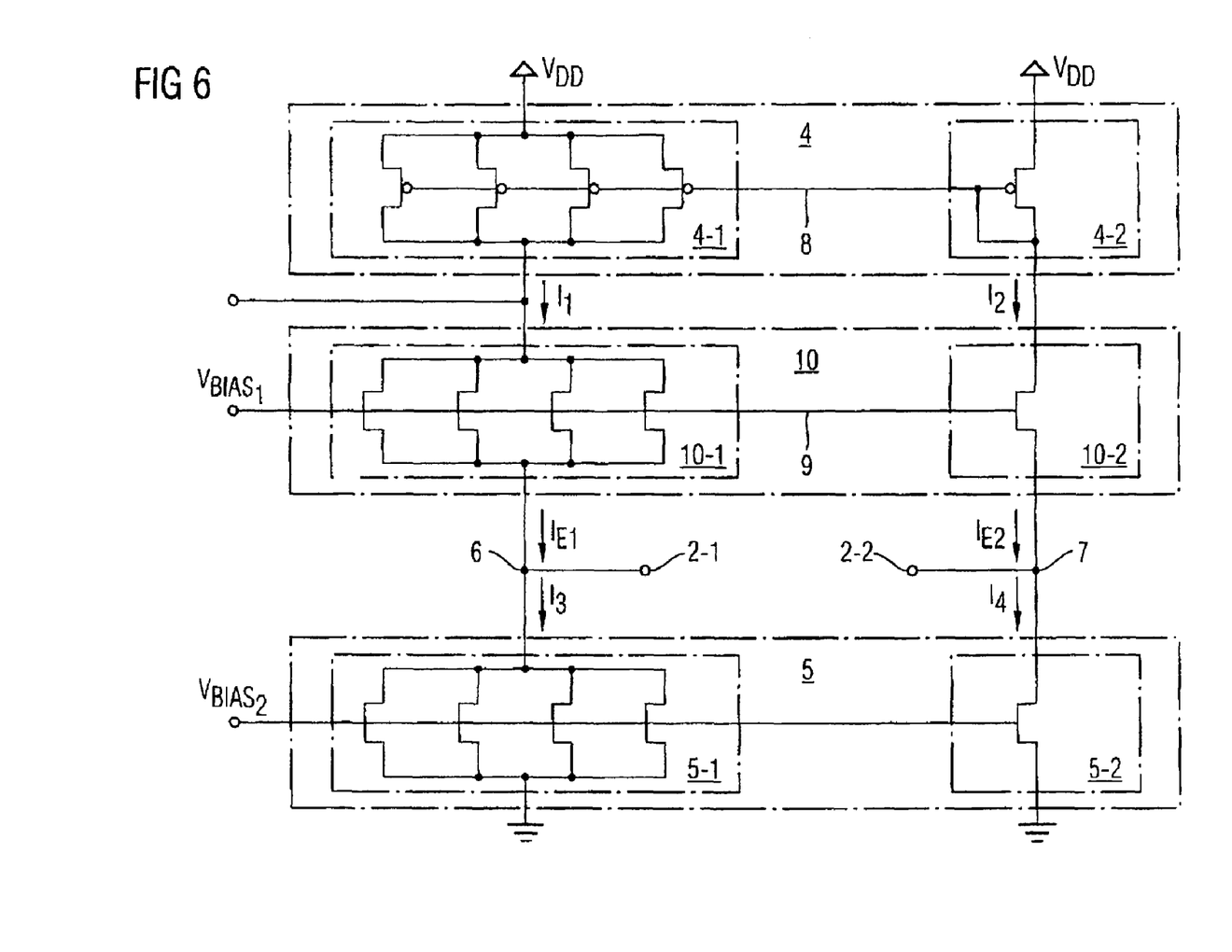
FIG. 6 shows a third embodiment of the amplifier according to the invention.

FIG. 6 shows a third embodiment of the amplifier circuit 1 according to the invention, in the case of which, in comparison to the embodiment illustrated in FIG. 4, the pair of transistors 10 is connected in the form of a cascode stage 10. The cascode stage 10 comprises a plurality of NMOS transistors 10-1, connected in parallel, and an NMOS transistor 10-2, whose gate connections are connected to one another. The current densities in the transistors 10-1, 10-2 are equal in value.

The third embodiment shown in FIG. 6 has a further pair of transistors 5, whose operating currents $I_3$, $I_4$ have the operating current ratio m. The gate connections are in this case connected to one another and receive a bias voltage $V_{bias}$.

The gate connections of the NMOS transistors within the cascode stage 10 are supplied with a bias voltage $V_{bias1}$. In the third embodiment illustrated in FIG. 6, the amplifier output 3 is not, as is the case in the second embodiment illustrated in FIG. 4, connected directly to the first current input connection 2-1, but is decoupled from said current input connection 2-1 by the cascode stage 10.

The transistors which are used in the current mirror 4, the pair of current sources 5 and in the cascode stage 10 are preferably dimensioned such that the operating currents produced have a predetermined current ratio m in relation to one another. The amplifier 1 according to the invention forces a specific current ratio m owing to the fact that the currents passed to the respective summation nodes 6, 7 have a specific ratio in relation to one another, an input current supplied to the summation point bringing the amplifier 1 out of its state of equilibrium such that one of the two supply voltages $V_{DD}$, $V_{SS}$ is output at the output of the amplifier 1. If the current occurring at the first signal input 2-1 is greater than the current applied to the second current input 2-2 by more than the factor m, the positive supply voltage $V_{DD}$ is output. If, on the other hand, the current applied to the current input 2-1 is less than m-times the value of the current applied to the current input 2-2, a negative supply voltage $V_{ss}$ is output by the amplifier circuit 1.

The amplifier 1 according to the invention, as is illustrated in FIGS. 3, 5, 6, can be realized simply in terms of circuitry and requires a small area when integrated on a chip.

FIGS. 3, 5, 6 show single-ended embodiments. These may also preferably be designed to be fully differential.

LIST OF REFERENCE NUMERALS

1 Amplifier
2 Current input
3 Voltage output
4 First pair of current sources
5 Second pair of current sources
6 Current node
7 Current node
8 Line
9 Line
10 Cascode stage
11 Line
12 PMOS
13 Current mirror circuit
14 Current input
15 Current output

The invention claimed is:

1. An amplifier for amplifying a signal applied to a signal input comprising:
   (a) a first pair of transistors operably connected to the signal input, wherein currents flowing through each transistor in the first pair of transistors have a specific operating current ratio in relation to one another;
   (b) a second pair of transistors operably connected to the first pair of transistors, wherein currents flowing through each transistor in the second pair of transistors have the same operating current ratio in relation to one another; and
   (c) a signal output of the amplifier provided between the first pair of transistors and the second pair of transistors;
   wherein each transistor of the first pair of transistors is connected to a supply voltage via a resistor, the ratio of the resistance values of the two resistors connecting the transistors of the first pair of transistors to the supply voltage corresponding to the operating current ratio.

2. The amplifier as claimed in claim 1, wherein the operating current ratio is not equal to one.

3. The amplifier as claimed in claim 1, wherein the transistors in the first pair of transistors comprise the same current density.

4. The amplifier as claimed in claim 1, wherein each transistor of the second pair of transistors comprises a load transistor connected to a supply voltage.

5. The amplifier as claimed in claim 1, wherein the first pair of transistors is connected in the form of a cascode stage.

6. The amplifier as claimed in claim 1, wherein the first pair of transistors is connected in the form of a cascode stage.

7. The amplifier as claimed in claim 6, further comprising:
   a third pair of transistors operably connected to the first pair of transistors, wherein currents flowing through each transistor in the third pair of transistors have the same operating current ratio in relation to one another.

8. The amplifier as claimed in claim 1, wherein the second pair of transistors forms a current mirror circuit.

* * * * *